United States Patent [19]

Lentine et al.

[11] Patent Number: 5,448,393
[45] Date of Patent: Sep. 5, 1995

[54] APPARATUS AND METHOD FOR REFERENCING AN OPTICAL RECEIVER

[75] Inventors: Anthony L. Lentine, Saint Charles, Ill.; David A. B. Miller, Fair Haven, N.J.

[73] Assignee: AT&T Corp., Murray Hill, N.J.

[21] Appl. No.: 164,589

[22] Filed: Dec. 9, 1993

[51] Int. Cl.[6] .................................. H04B 10/06
[52] U.S. Cl. ...................... 359/193; 250/214 LS; 250/551; 359/189
[58] Field of Search .................. 330/59, 308; 359/189, 359/193, 195; 250/214 LS, 551

[56] References Cited

U.S. PATENT DOCUMENTS

| | | | |
|---|---|---|---|
| 4,066,973 | 1/1978 | McNally | 330/59 |
| 4,467,191 | 8/1984 | Chalfin | 330/308 |
| 5,198,656 | 3/1993 | Chirovsky | 250/214 LS |
| 5,254,851 | 10/1993 | Yamakawa | 359/189 |
| 5,315,105 | 5/1994 | Matsuda | 250/214 LS |

OTHER PUBLICATIONS

D'Asaro, L. A., Chirovsky, L. M. F., Laskowski, E. J., Pei, S. S., Leibenguth, R. E., Woodward, T. K., Focht, M., Lentine, A. L., Asom, M. T., Guth, G., Kopf, R. F., Kuo, J. M., Pearton, S. J., Przybylek, G. J., Ren, F., and Smith, L. E., "Batch Fabrication and Structure of Integrated GaAs–Al$_x$Ga$_{1-x}$As Field-Effect Transistor-Self-Electro-optic Effect Devices (FET-SEED's)," IEEE Electron Device Letters, vol. 13, No. 10, Oct. 1992, pp. 528–531.

Rogers, Dennis L., "Integrated Optical Receivers Using MSM Detectors," Journal of Lightwave Technology, vol. 9, No. 12, Dec. 1991, pp. 1635–1638.

Seo, Jong-Wook, Ketterson, Andrew A., Ballegeer, Daniel G., Cheng, Keh-Yung, Adesida, Ilesanmi, Li, Xiaonan, and Gessert, Timothy, "A Comparative Study of Metal-Semiconductor-Metal Photodetectors On GaAs With Indium-Tin-Oxide and Ti/Au Electrodes," IEEE Photonics Technology Letters, vol. 4, No. 8, Aug. 1992, pp. 888–890.

Streibl, Norbert, "Beam Shaping With Optical Array Generators," Review Paper, Journal of Modern Optics, vol. 36, No. 12, 1989, pp. 1559–1573.

Primary Examiner—Leslie Pascal

[57] ABSTRACT

An optical receiver apparatus and method for receiving optical signals and for generating output signals is disclosed. In particular, a photoconductor is illuminated with a preset beam before an input beam is incident on a detector to reset an input FET. An optical receiver according to the invention controls the voltage swings and the allowed voltages at the input stage, and can be monolithically integrated to allow uniform operation across a semiconductor chip and between circuits on different chips.

19 Claims, 4 Drawing Sheets

APPARATUS AND METHOD FOR REFERENCING AN OPTICAL RECEIVER

TECHNICAL FIELD

This invention relates to an optoelectronic apparatus and a method for receiving optical signals. In particular, the present invention relates to an optical receiver which utilizes a photoconductor to reset an input stage field-effect transistor before an optical input beam is received.

BACKGROUND OF THE INVENTION

Optical receivers are illuminated with optical input beams and respond by generating either optical or electrical output signals. These receivers are now being fabricated as the input stages of very large scale integrated (VLSI) circuits on semiconductor chips for use in communications equipment, and thus their performance characteristics must be improved.

A typical prior art optical receiver circuit has a detector stage comprising two photo-diodes connected in series having a first electrical node between them, and an input stage comprising two field-effect transistors (FETs), a load FET and an input FET, connected in series. The gate input of the input FET is connected to the first electrical node. The output of the receiver circuit is taken from a second electrical node located between the FETs. A first optical input beam incident on the first photo-diode causes a first logic level output to be generated, and a complementary optical input beam alternately incident on the second photo-diode causes a second logic level output to be generated.

One problem that arises in VLSI circuit arrays is controlling the allowed voltages and voltage swings that are present at such optical receivers. If these voltages are not controlled, the input light beams must have large optical energies to ensure sufficient voltage swings to switch the input FET to the desired state. One approach for controlling the voltage swing is to use clamping diodes at the detector stage. However, additional clamping diode voltages are then required, which complicates system design since two additional voltage power supplies for each receiver circuit are then typically needed.

Further, the clamping diode voltages must be carefully set relative to the local voltage levels of the circuit. These local voltages may vary from place to place on a semiconductor chip. Therefore, maintaining optimum clamping conditions across an entire chip may be difficult.

Yet further, the input FET threshold must be considered when setting the clamping diode voltages. Since threshold variations may exist across a chip or between chips, and since different chips may require different voltages, system design is further complicated.

SUMMARY OF THE INVENTION

The present invention solves the problems of voltage swings and allowed voltages at the optical receiver without the drawbacks of diode-clamped receivers, to allow more uniform operation across a semiconductor chip and between circuits on different chips.

In particular, an optical receiver according to the invention has first and second detectors connected in series having a first electrical node between them. A load FET and an input FET are connected in series, and have an output node between them. A photoconductor and the gate of the input FET are connected to the first electrical node.

During operation, a pulsed light beam or preset beam is first incident on the photoconductor before either of two data input beams is incident on a detector. The preset beam causes the photoconductor to momentarily conduct which causes the gate input of the input FET to change to its equilibrium voltage state. Thus, when a first input data beam is incident on the first detector, a first voltage is generated at the first electrical node, and then the input FET generates an output dependent on the first voltage. The preset beam is then again incident on the photoconductor to reset the input FET. Then, if a complementary input beam is incident on the second detector, a second voltage is generated and the input FET generates an output dependent on the second voltage. Thus, the input FET is always reset or prepared in the same manner by the photoconductor, independent of supply voltages and without using clamping diodes.

Another embodiment of the present invention utilizes two photo-diodes, connected back-to-back, as a photoconductor. The two photo-diodes are connected to the first electrical node and operate in the same manner as described above.

An optical receiver according to the invention can be fabricated as a monolithic integrated circuit. In particular, the optical receiver can be manufactured utilizing FET-SEED technology.

Further features and advantages of the present invention will be readily apparent to those of skill in the art in view of the following detailed description when taken in connection with the following drawings.

DETAILED DESCRIPTION

Figure 1:
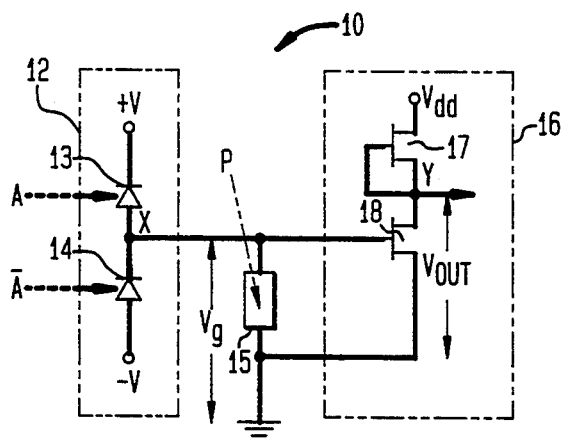
FIG. 1 is a circuit diagram of an optical receiver according to the present invention.

FIG. 1 is a circuit diagram of an optical receiver 10 according to the present invention. The optical receiver 10 comprises a detector section 12, a photoconductor 15 and an input section 16. The detector section 12 comprises two series-connected photo-diodes 13 and 14 having an electrical node X between them. The input section 16 comprises two series-connected field-effect transistors (FETs), a load FET 17 and an input FET 18. The photoconductor 15 is connected to node X and to the gate input of input FET 18. The voltage output $V_{out}$ of the optical receiver circuit 10 is taken from a second electrical node Y located between the FETs 17 and 18.

During operation, optical input beams A and $\overline{A}$ are alternately incident on photo-diodes 13 and 14, which generate electrical signals at node X. The beams A and $\overline{A}$ are complements of one another, however, it should be understood that it is not necessary for a beam that is nominally off to be totally dark. It is sufficient that for a logic 1 state, beam A is substantially brighter than beam $\overline{A}$, and for a logic zero state that beam $\overline{A}$ is substantially brighter than beam A. For simplicity of explanation, and to consider the most extreme case, we will discuss examples in which the nominally off beam may be totally dark.

In order to understand how the optical receiver 10 functions, consider the case where the photoconductor 15 is not connected to node X, and where the input beams A and $\overline{A}$ cause voltage swings at $V_{out}$ which represent logic 1 and logic 0 states, respectively. The logic 1 state corresponds to beam A being on, and the logic 0 state corresponds to beam $\overline{A}$ being on. For example, in an equilibrium state the voltage $V_g$ at node X is 0.0 volts so that when an input beam A is on or incident on photo-diode 13 the voltage $V_g$ rises to 0.2 volts. Similarly, at equilibrium when an optical input beam $\overline{a}$ is on or incident on photo-diode 14 the voltage $V_g$ drops to −0.2 volts. Thus, starting from the equilibrium state, if a string of three consecutive logic 1 signals is received the voltage at node X will increase to 0.6 volts. If a logic 0 signal next follows the string of three consecutive logic 1 signals then the voltage at node X must be decreased from 0.6 to −0.2 volts or an incorrect output will occur at node Y. In order to reduce the voltage from 0.6 to −0.2 volts, a substantial increase in optical energy that is proportional to the voltage swing is required. Thus, twice the optical energy would be required to switch from 0.6 to −0.2 volts, a swing of 0.8 volts, than for a receiver which switches between ±0.2 volts, a swing of 0.4 volts.

Prior art optical receivers utilized clamping diodes to restrict the range of allowed voltages, however, additional voltage power supplies were then required which complicated system design. The present invention utilizes a photoconductor to reset the voltage $V_g$ before an input beam is incident on a detector, thus avoiding the need for increased optical energy and for clamping diode voltage sources.

Referring to FIG. 1, during operation according to the present invention, a pulsed preset beam P illuminates the photoconductor 15 a short time before an input signal beam A is incident upon the photo-diode 13. The preset beam P can be shorter in duration than an input beam. The preset beam P causes the photoconductor 15 to conduct momentarily to set the input voltage of the gate, $V_g$, of the input FET 18 to be equal to the source voltage, or ground as shown in FIG. 1.

Figure 2:
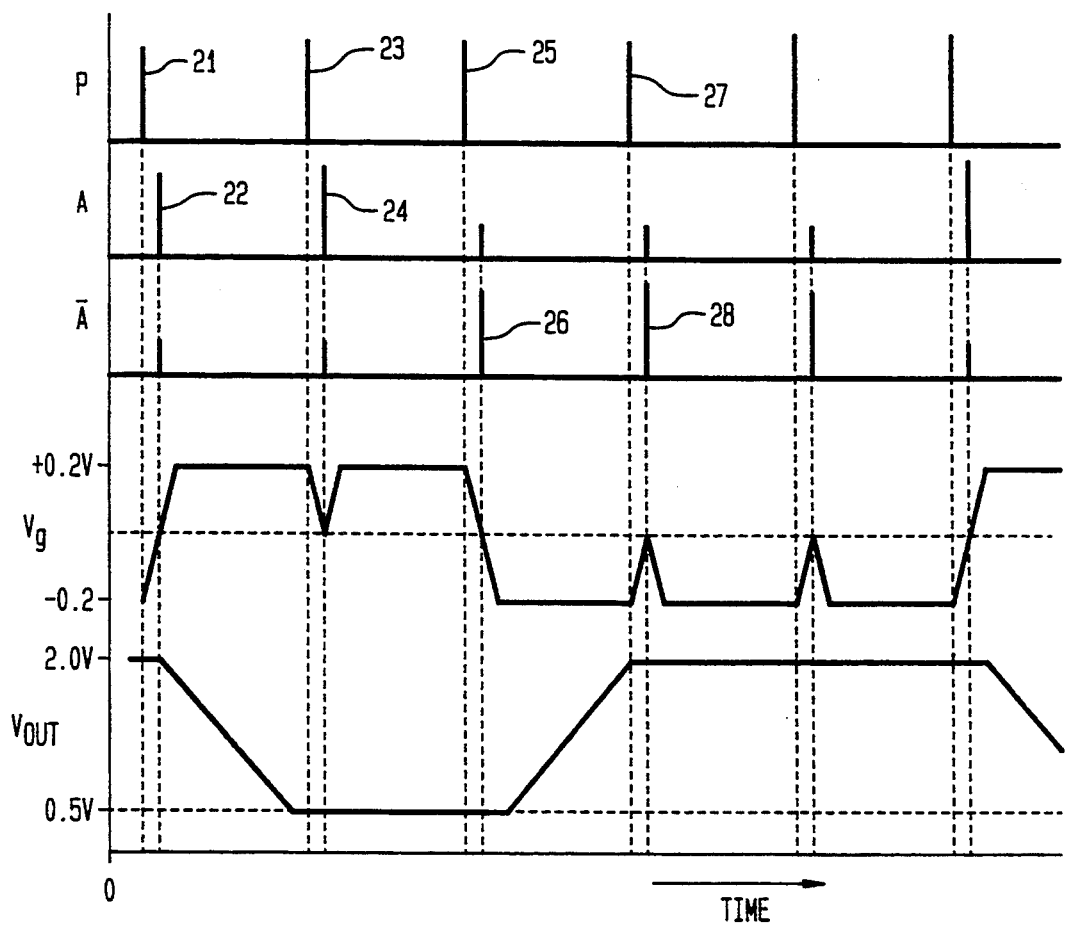
FIG. 2 is a timing diagram illustrating the sequence of optical signals and generated voltages for the receiver of FIG. 1.

FIG. 2 is a timing diagram illustrating the sequence of voltages, $V_g$ and $V_{out}$, generated at nodes X and Y at as the preset beam P and input beams A and $\overline{A}$ are incident on the optical receiver 10 of FIG. 1. The output voltage $V_{out}$ varies between two logic levels represented by 2.0 and 0.5 volts. In FIG. 2, $V_{out}$ is 2.0 volts and $V_g$ is −0.2 volts at time zero.

Referring to FIG. 2, a first preset beam P is shown as pulse 21 and it causes the voltage $V_g$ at the gate input of FET 18 of FIG. 1 to go to zero. Next, an input beam 22, which is applied as an optical input signal A, is incident on detector 13 causing $V_g$ to rise to 0.2 volts and $V_{out}$ to fall to 0.5 volts. The output voltage $V_{out}$ is sampled at about the same time as the next preset beam 23 is received. When preset beam 23 is received, $V_g$ returns to 0 volts. Input beam 24 then arrives causing $V_g$ to again go to 0.2 volts which has no effect on $V_{out}$ which remains at 0.5 volts. Next, optical preset beam 25 causes $V_g$ to return to 0 volts, and an input beam 26, which is applied as an optical input signal $\overline{A}$, is incident on photo-diode 14 causing $V_g$ to fall to −0.2 volts and $V_{out}$ to rise towards 2.0 volts. The next preset beam 27 again resets $V_g$ to 0 volts, and another input beam 28 is received but has no effect on $V_{out}$ which stays at 2.0 volts. Thus, the preset beams 21, 23, 25, etc. operate to return the voltage $V_g$ to zero to prepare the input FET 18 in the same manner before each input beam is incident on a photo-diode. In this example, the photoconductor 15 thus restricts the voltage $V_g$ to be between ±0.2 volts. Thus, the optical receiver circuit 10 controls the voltage swing at $V_g$ without requiring clamping diodes and their related supply voltages.

The optical receiver 10 can be used in an optical system comprising many optical receivers and logic devices, and can be fabricated utilizing any FET-based technology. In addition, the load FET 17 can be replaced by a resistor if desired. However, the optical receiver circuit is beneficially implemented as a monolithic integrated circuit for use as part of an array of devices that use many receivers.

Monolithic optically addressed circuits have been realized which comprise controllable optical elements and semiconductor microelectronic elements. For example, p-i-n multiple quantum well (MQW) devices, designed for normal incidence operation as both a detector and an optical modulator for 850 nanometer light, have been integrated with GaAs FET's. Such a combination of elements is referred to as a FET-SEED circuit.

Integration of FETs and MQW modulators provides compact arrays of amplifier circuits, high fabrication yields, and increased functionality by providing digital electronic processing between the optical input and output. Process technology suitable for fabrication of FET-SEED devices has been disclosed in a paper by L A D'Asaro et al , . "Batch Fabrication and Structure of Integrated GaAs-Al$_x$ Ga$_{1-x}$ As Field-Effect Transistor Self-Electro-optic Effect Devices (FET-SEEDS)", *IEEE Electronic Device Letters*, Vol. 13, No. 10, October 1992, pp. 528–531, which is incorporated by reference herein.

Figure 3:
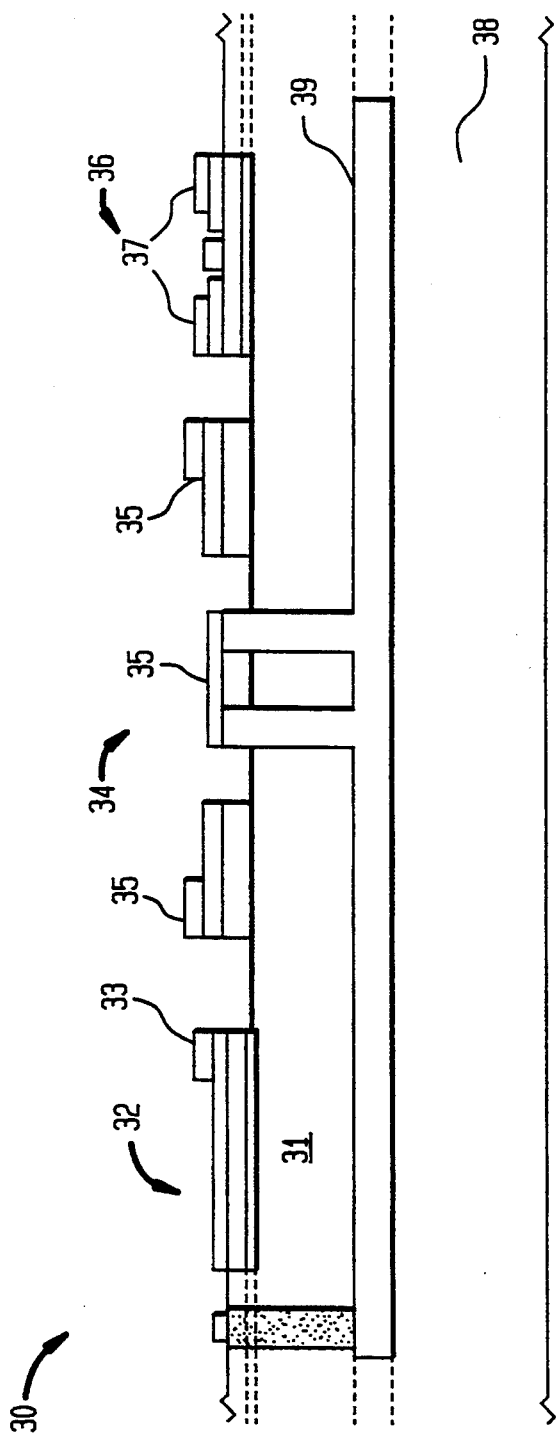
FIG. 3 is a simplified cross-sectional schematic diagram of the wafer structure of FET-SEED components which could suitably be utilized to realize the present invention.

FIG. 3 is a simplified cross-sectional schematic diagram of a wafer structure 30 of FET-SEED components which could suitably be used to realize the receiver circuit 10 of FIG. 1. Shown are an MQW modulator 32 having a metallic contact 33, two back-to-back diodes configured as a photoconductor 34 having metal contacts 35, and a depletion-mode field effect transistor (DMT) 36 having metal contacts 37. The components 32, 34 and 36 are fabricated on a semi-insulating GaAs substrate, having a mirror stack layer 38, p-layer 39 and multiple-quantum wells 31. The MQW modulator 32 can be used as either an optical modulator or a photo-diode, the photoconductor 34 corresponds to photoconductor 15 of FIG. 1 and is utilized as described above, and the DMT 36 can be used as part of an input circuit to process signals from the MQW modulator. The fabrication of an FET-SEED circuit to realize the present optical receiver relies on the application of known interconnect fabrication techniques.

Figure 4:
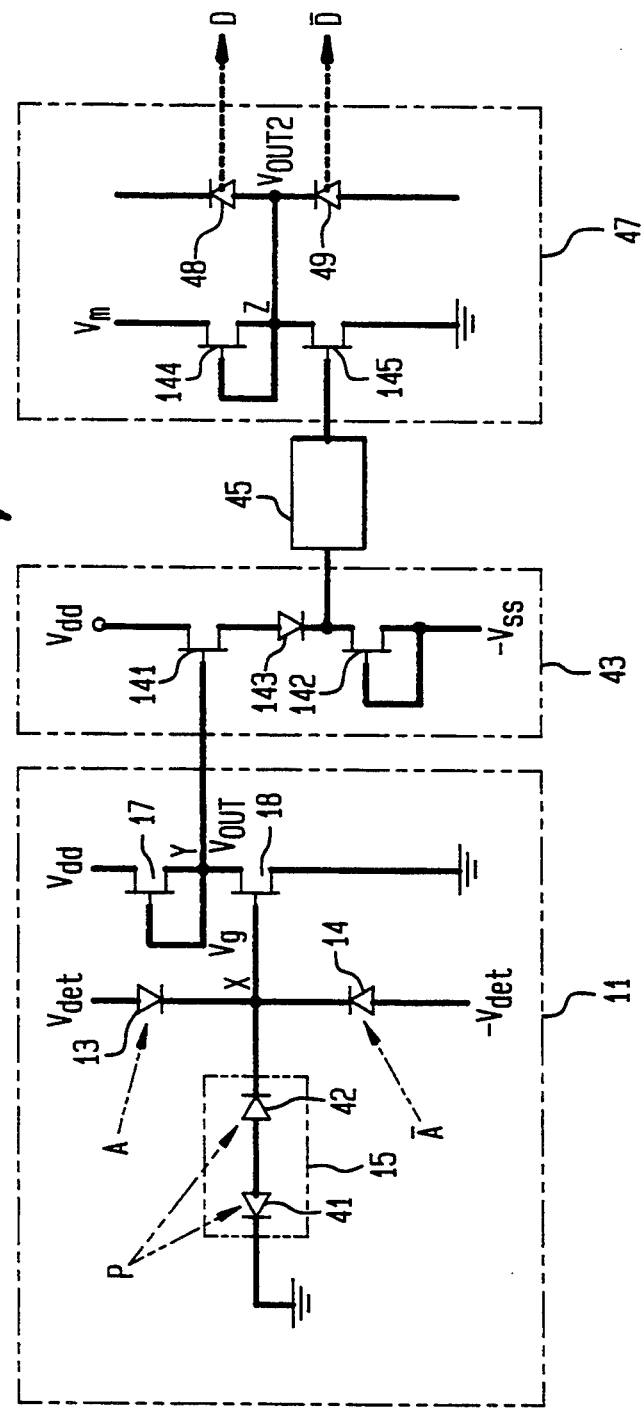
FIG. 4 is a simplified schematic diagram of an optical circuit which utilizes another embodiment of an optical receiver according to the present invention.

FIG. 4 is a simplified illustration of a complete optical circuit 40 which utilizes another embodiment of an optical receiver 11 according to the present invention. The same reference numerals used in FIG. 1 are used in FIG. 4 to identify like components. Therefore, two detectors 13 and 14 are connected in series and have a node X between them, and a load FET 17 and an input FET 18 are connected in series at a node Y. The gate input of the input FET 18 and a photoconductor means 15 are connected to the node X. In this embodiment, the photoconductor means 15 comprises two photo-diodes 41 and 42 connected back-to-back, which is also illustrated in FIG. 3 as photoconductor 34. An alternative form of photoconductor is a metal-semiconductor-metal (MSM) structure, as described, for example, in articles by J-W Seo et al , "A Comparative Study of Metal-Semiconductor-Metal Photoconductors on GaAs with Indium-Tin-Oxide and Ti/Au Electrodes", *IEEE Photonics Technology Letters*, Vol. 4, No. 8, August 1992, pp. 888–890, and by D. L. Rogers, "Integrated Optical Receivers Using MSM Detectors", *Journal of Lightwave Technology*, Vol. 9, No. 12, December 1991, pp. 1635–1638, which are incorporated by reference herein.

Referring again to FIG. 4, the output node Y of the optical receiver 11 is connected to a level shifter stage 43 comprising two FETs 141, 142 and a diode 143 connected together between voltage sources $V_{dd}$ and $-V_{ss}$, as shown. Additional logic circuitry 45 may be connected to the level shifter stage 43, and to an optical output section 47. The optical output section 47 comprises a modulator driver comprising two FETs 144, 145 connected in series as shown with a node Z between them, and two output photo-diodes 48 and 49 connected to node Z. The output photo-diodes generate optical output signals D and $\bar{d}$, respectively. The operation of the optical circuit 40 is discussed below with reference to FIGS. 4 and 5.

Figure 5:
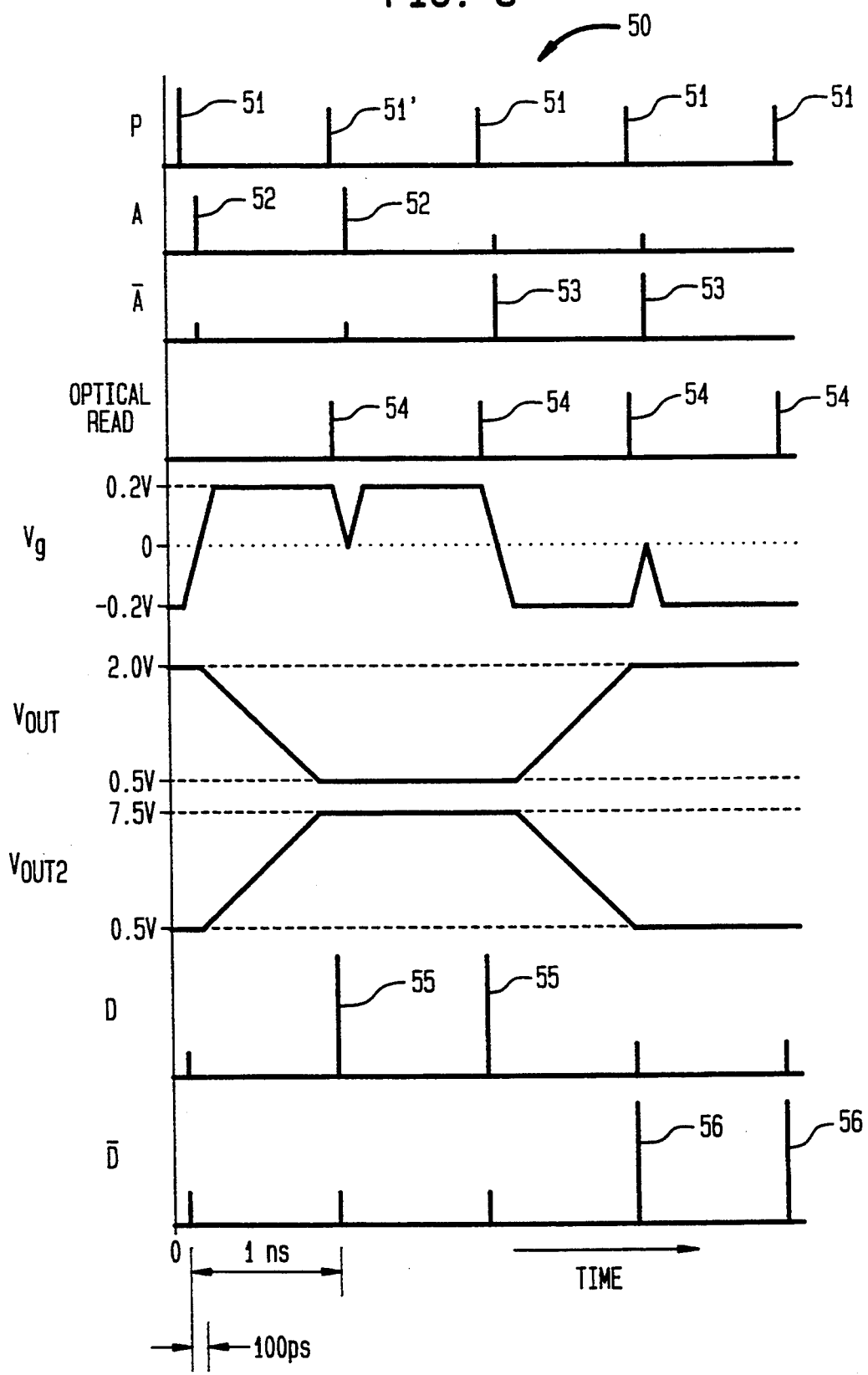
FIG. 5 is a timing diagram illustrating the sequence of optical signals and generated voltages for the optical circuit of FIG. 4.

FIG. 5 is a timing diagram 50, illustrating the sequence of optical signals and voltages generated by the optical circuit 40 of FIG. 4. The illustrated voltage ranges for the voltages $V_g$, $V_{out}$ and $V_{out2}$ and beam pulsewidths in the picosecond range, although not drawn to scale, are typical of those found in monolithically integrated receiver circuits. Operation of the optical receiver 11 of FIG. 4 is exactly as explained above with respect to the receiver 10 of FIG. 1, however, to ensure correct operation of the receiver 11 the pulse beam P must be simultaneously incident on both photo-diodes 41 and 42 of the photoconductor 15.

The photo-diodes 41 and 42 of photoconductor 15 operate in the following manner. If the voltage $V_g$ is initially 0.2 volts, then photo-diode 41 is forward biased, and the preset beam will drive photo-diode 42 to become forward biased to cause $V_g$ to go to zero. Likewise, if $V_g$ is initially −0.2 volts, then photo-diode 42 is forward biased and the preset beam will drive photo-diode 41 to become forward biased to cause $V_g$ to go to zero. Thus, when both photo-diodes 41 and 42 are forward-biased their voltages cancel and $V_g$ goes to zero.

Referring to FIGS. 4 and 5, the preset beams P, illustrated as pulses 51, occur before either input beams A or $\bar{a}$, shown as pulses 52 and 53, are incident on the input photo-diodes 13 or 14. The pulsewidth of the preset beams P and the optical input beams A and $\bar{A}$ is approximately 10 pico-seconds (ps), and the time between consecutive preset beams P is approximately 1 nanosecond (ns). An input beam A or $\bar{A}$ is incident on one of the photo-diodes 13 or 14 approximately 100 ps after the preset beam P is incident on the photoconductor 15. As shown in FIG. 5, optical read signals 54 are generated approximately 1 ns after each preset beam 51, at which time the optical modulators 48 and 49 are sampled.

Modulator 48 generates a signal D corresponding to a logic 1, depicted as pulses 55, and modulator 49 generates a signal $\bar{D}$ corresponding to a logic 0, shown as pulses 56.

The optical receiver 11 of FIG. 4 operates exactly as the optical receiver 10 of FIG. 1. However, the timing diagram of FIG. 5 contains more detail than that of FIG. 2. In particular, FIG. 5 shows additional signals such as optical read signals 54, a voltage $V_{out2}$ taken at node Z of FIG. 4, and optical output signals D and $\bar{D}$ (55 and 56) taken at optical modulators 48 and 49, respectively. In the example shown in FIG. 5, at time zero, $V_g$ is −0.2 volts, $V_{out}$ is 2.0 volts and $V_{out2}$ is 0.5 volts. The first preset beam 51 causes $V_g$ to go to zero, and then an input beam 52 causes $V_g$ to rise to 0.2 volts, $V_{out}$ to drop towards 0.5 volts and $V_{out2}$ to rise to 7.5 volts. Preferably, the photoconductor used in the receiver circuit, whether of the MSM or back-to-back diode form, will recover to become substantially no longer conducting in the time interval between the preset pulse 51 and an input pulse 52 or 53. At approximately the same time as the next preset beam 51' arrives, an optical read beam 54 is used to read-out the output modulators 48 and 49, and in the first instance the output pulse 55 is present. The cycle continues as subsequent preset beams reset the voltage $V_g$ at the gate input of the FET 18 to zero.

As shown in FIG. 5, $V_{out}$ is restricted to a range between 2.0 and 0.5 volts, and the two voltage logic levels at $V_{out2}$ are 7.5 and 0.5 volts. It should be understood, however, that the voltages and pulsewidths described above are merely illustrative and could be different depending on design choice. Further, electrical outputs can be generated in addition to, or in the absence of, the optical outputs illustrated.

Referring again to FIGS. 1 and 4, when the FETs 17 and 18 of the receivers 10 and 11 are fabricated to be essentially identical (i.e. the same physical size), the voltage $V_{out}$ will be set at $V_{dd}/2$ because the source and gate voltages of both FETs 17 and 18 are equal. In this case, the optical receiver is then optimally sensitive to subsequent changes in the input voltage $V_g$.

In monolithically integrated optical systems, power-supply beams exist that are used to read out output modulators. Some of these beams could be supplied in a form for use by the photoconductor 15 of the optical receiver of the present invention. Methods for providing preset beams, such as using free space optics to image the preset pulses onto several devices within an array, have been disclosed in a paper by N. Steibl, "Beam Shaping With Optical Array Generators", *Journal of Modern Optics*, Vol. 36, pp. 1559–1573(1989), which is incorporated by reference herein.

If the preset beams are sufficiently short, on the order of 50 ps or less, then negligible voltage changes will occur at node Y due to the preset beam during the read out time. This is true because a signal pulse A or $\bar{a}$ follows the preset beam P by an amount of time, shown as 100 ps in FIG. 4, that is longer than the response time of the photoconductor 15, but shorter than the response time of the output node Y of the FET 18.

An optical receiver according to the present invention dissipates substantially the same amount of electrical power as prior art optical receivers because the bias voltages for the FETs are similar. However, a receiver according to the invention consumes less optical energy on average than a prior art diode-clamped receiver. This is advantageous for an FET-SEED optical receiver since limited laser power is available in such systems.

It is to be understood that the above-described embodiments are merely illustrative of the present invention, and that many variations can be devised by those of skill in the art without departing from the scope of the invention.

We claim:

1. An optical receiver, comprising:
    first and second detectors connected in series and having a first electrical node between them, wherein the first detector generates a first voltage in response to an input signal beam and the second detector generates a second voltage in response to a complementary input signal beam;
    photoconductor means connected to the first electrical node for generating an electrical pulse signal when a preset beam, which arrives a predetermined time before either of the input signal beams, is incident on it; and
    output means connected to the first electrical node, wherein the output means is reset by the electrical pulse signal and responds to the first voltage to generate a first electrical output signal and responds to the second voltage to generate a complementary output signal.

2. The apparatus of claim 1, wherein the output means comprises:
    transistor means having a control input terminal connected to the first electrical node; and
    electrical load means connected in series with the transistor means at a second electrical node.

3. The apparatus of claim 2, wherein the transistor means and the load means are field-effect transistors.

4. The apparatus of claim 1, wherein the photoconductor means comprises two photo-diodes connected back to back.

5. The apparatus of claim 1, wherein the first and second detector means, the photoconductor means and the output means comprise a monolithic integrated circuit.

6. The apparatus of claim 5, wherein the photoconductor means is a metal-semiconductor-metal photoconductive detector.

7. The apparatus of claim 5, wherein the first and second detector means are multiple quantum well p-i-n diodes.

8. An optical receiver, comprising:
    first and second detectors connected in series and responsive to a first input beam and to a second input beam, respectively;
    output means connected to the first and second detectors for generating first and second outputs; and
    photoconductor means connected to the output means and responsive to a preset beam for resetting the output means.

9. The apparatus of claim 8, wherein the output means comprises:
    transistor means having a control input connected to the photoconductor means; and
    an electrical load connected to the transistor means.

10. The apparatus of claim 9, wherein the transistor means and the electrical load are field-effect transistors.

11. The apparatus of claim 8, wherein the photoconductor means comprises two photo-diodes connected back to back.

12. The apparatus of claim 8, wherein the first and second detectors, the photoconductor means and the output means comprise a monolithic integrated circuit.

13. The apparatus of claim 12, wherein the photoconductor means is a metal-semiconductor-metal photoconductive detector.

14. The apparatus of claim 12, wherein the first and second detectors are multiple quantum well p-i-n diodes.

15. A method for referencing an optical receiver, comprising:
    illuminating a photoconductor with a pulse beam to generate a preset signal;
    resetting an output means with the preset signal;
    illuminating a first detector with an input beam a predetermined time after the pulse beam to generate a first electrical input signal; and
    generating a first output signal with the output means based on the first electrical input signal.

16. The method of claim 15, further comprising:
    illuminating the photoconductor with the pulse beam to generate another preset signal;
    resetting the output means with the preset signal;
    illuminating a second detector with a complementary input beam to generate a complementary input signal; and
    generating a second output signal with the output means based on the complementary input signal.

17. The method of claim 15, wherein the pulse beam is shorter than the input beam.

18. The method of claim 15, wherein the pulse beam and the input beam are of substantially the same duration.

19. The method of claim 15, wherein the photoconductor becomes substantially no longer conducting in the time interval between the pulse beam and the input beam.

* * * * *